Figures 1A, 1B, 1C:
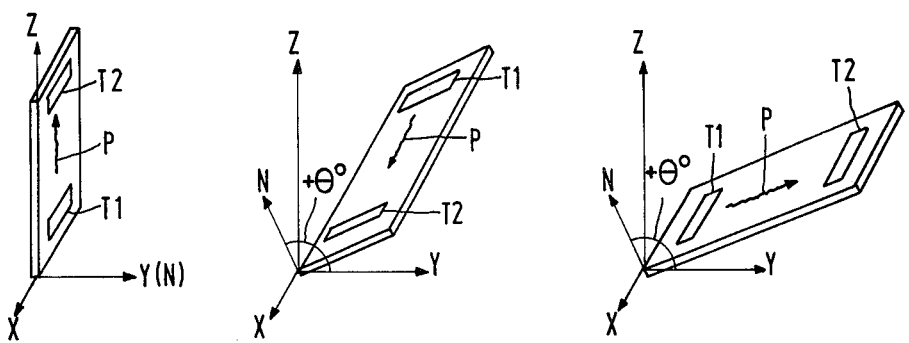

United States Patent [19]
Milsom et al.

[11] 4,409,571
[45] Oct. 11, 1983

[54] SURFACE ACOUSTIC WAVE FILTERS

[75] Inventors: Robert F. Milsom, Redhill; Robert J. Murray, Horley; Ian Flinn, Crawley, all of England

[73] Assignee: U.S. Philips Corporation, New York, N.Y.

[21] Appl. No.: 303,806

[22] Filed: Sep. 21, 1981

[30] Foreign Application Priority Data

Oct. 8, 1980 [GB] United Kingdom ............... 8032360

[51] Int. Cl.³ ...................... H03H 9/64; H03H 9/145
[52] U.S. Cl. ............................. 333/196; 310/313 A; 333/193
[58] Field of Search ............................. 333/150–155, 333/193–196; 310/313 R, 313 A, 313 B, 313 C, 313 D, 366

[56] References Cited

U.S. PATENT DOCUMENTS 3,956,646  5/1976  Shibayama et al. ............. 333/150 X
4,016,440  4/1977  Wagers .

Primary Examiner—Marvin L. Nussbaum
Attorney, Agent, or Firm—Robert T. Mayer; Bernard Franzblau

[57] ABSTRACT

Surface acoustic wave bandpass transversal filters, e.g. television intermediate frequency filters, comprising a $+\theta°$ rotated Y-cut X-propagating lithium niobate substrate with $\theta$ in the range from 121° to 127°, preferably 123° to 125°. For a suitable range of filter bandwidths (35 db bandwidth between 0.05 and 0.5) these substrates provide reduced degradation of the filter upper stopband predominantly due to indirect bulk shear waves in the frequency range from the passband up to the frequency where direct bulk longitudinal wave degradation becomes significant. This frequency range is 41.5 MHz to approximately 55 MHz for a U.K. system t.v. i.f. filter and is 60.25 MHz to approximately 90 MHz for a Japanese system t.v. i.f. filter.

6 Claims, 12 Drawing Figures

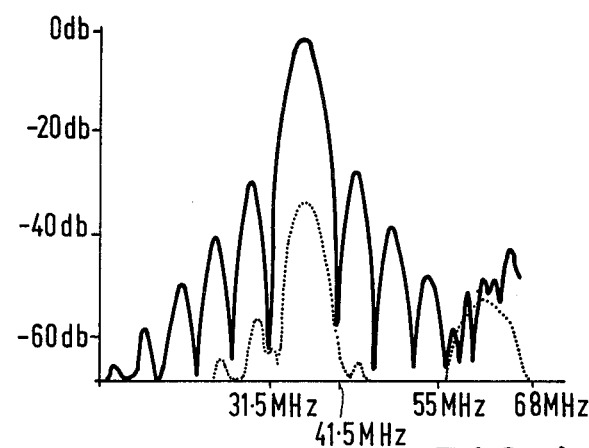
FIG.4
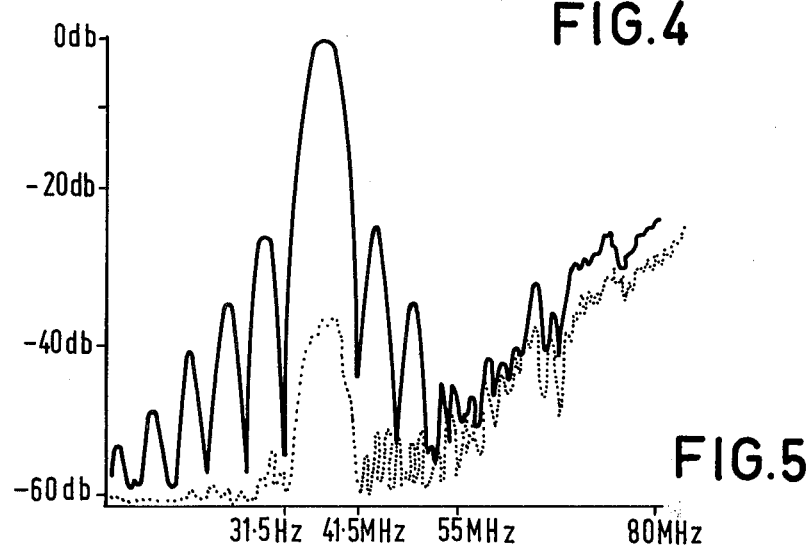
FIG.5
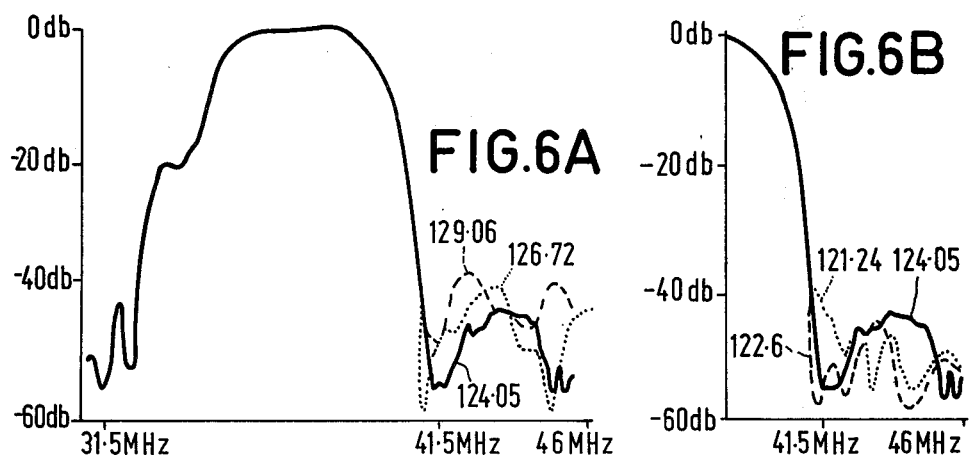
FIG.6A
FIG.6B

SURFACE ACOUSTIC WAVE FILTERS

This invention relates to surface acoustic wave bandpass transversal filters comprising a $+\theta°$ rotated Y-cut lithium niobate substrate having an input and an output transducer arranged on the substrate to respectively launch and receive surface acoustic waves propagating in the X direction.

Television receiver intermediate frequency filters in accordance with the above description are known in which $\theta°$ is substantially 127.86° following the recommendation in the article by K. Shibayama et al. in the Proceedings of the IEEE, Vol. 64, No. 5, May 1976 at pages 595 to 597 that this is the optimum cut for surface acoustic wave filters. These filters have a sufficiently low bulk wave generation by the input transducer such that they do not usually incorporate a multistrip coupler as was previously the case with conventional surface acoustic wave television receiver intermediate frequency filters using a substrate of Y-cut Z-propagating lithium niobate.

An object of this invention is to provide surface acoustic wave bandpass transversal filters as described in the first paragraph of this specification which, for a particular range of bandwidths and a particular upper stopband frequency range, also have low bulk wave generation by the input transducer but utilize alternative substrates to that recommended in the above-mentioned article by Shibayama et al.

According to this invention there is provided a surface acoustic wave bandpass transversal filter as described in the first paragraph of this specification, characterised in that the spacing, overlap and the number of strip electrodes in the interdigital electrode arrays of the input and output transducers are chosen so as to cause the transfer response from the input of the input transducer to the output of the output transducer of the filter to have a passband with a 35 db fractional bandwidth $\Delta$ in the range 0.05 to 0.5, and to have an upper stopband of at least 35 db from said passband up to a frequency approximately equal to $$\left(\frac{V_L}{V_S} - \frac{\Delta}{2}\right) F_C$$

where $V_L$ and $V_S$ are the velocities in the X direction of the substrate of longitudinal bulk acoustic waves and surface acoustic waves respectively, and $F_C$ is the center frequency relative to the 35 db fractional bandwidth $\Delta$, and in that $\theta°$ is in the range of 121° to 127°. The value of $\theta$ is chosen in the range specified for reduced total bulk wave power generation by the input transducer and hence reduced degradation of the filter stopband in the upper frequency range specified while at the same time providing a satisfactory electromechanical coupling coefficient and hence insertion loss of the filter. The surface acoustic wave response of the filter may be shaped to provide a television receiver intermediate frequency filter with $\Delta$ in the range of 0.1 to 0.3, in which case $\theta°$ is more suitably in the range 122° to 127°. The optimum value for $\theta°$ will usually be found in the range 123° to 125°.

The above-mentioned article by Shibayama et al. discloses the results of experiments performed using substrates cut at intervals of about 1° from $\theta° = 123.60°$ to $\theta° = 131.88°$. However, since in each case a pair of unweighted transducers is used, the surface acoustic wave response of all the devices must be $(\sin x/x)^4$ in form and hence the side lobe height is such that none of these devices has a surface acoustic wave stopband response in accordance with this invention. In U.K. Patent Specification No. 1,491,250, the inventors K. Shibayama et al. recommend the same $\theta°$ rotated Y-cut X-propagating lithium niobate in which $\theta°$ is 127.86° as an optimum substrate for elastic surface wave devices. Claim 1 of this Patent Specification specifies $\theta$ as lying in the range 125.6° to 130.1°. However, since no details are disclosed concerning filter bandwidths or stopband levels or ranges, U.K. Patent Specification No. 1,491,250 does not disclose filters in accordance with this invention.

The introduction of the above-mentioned article by Shibayama et al. expresses concern about an unknown spurious signal which interferes with the stopband attenuation of filters using previously recommended 131° rotated Y-cut X-propagating lithium niobate substrates. Although filter stopband attenuation is not explicitly mentioned again, the article clearly teaches that this previously unknown spurious signal is due to the slow shear wave travelling in the vicinity of the substrate surface between two surface acoustic wave interdigital transducers and states that the amplitude of this spurious wave decreases rapidly as $\theta$ decreases from 131° to 127.86° and increases when $\theta$ decreases below 127.86°. U.K. Patent Specification No. 1,491,250 has substantially the same teaching as the Shibayama et al. article. The introduction of the Specification also mentions 131° rotated Y-cut X-propagating lithium niobate, quotes its high electromechanical coupling coefficient and states that "With the rotated Y-cut plate, however, where the Rayleigh wave and the shear wave component of a bulk wave are propagated at velocities closely approximating each other the shear wave acts as a spurious component" which "prevents a filter from achieving sufficient guaranteed attenuation in the stopband". The body of the Specification states that the spurious components can be suppressed to a higher extent than 40 db relative to the Rayleigh wave where the angle of rotation $\theta$ is in the range 125.6° to 130.1° and moreover to a higher extent than 65 db where $\theta$ is 127.86°.

This invention is based on the combination of three factors. The first factor is the realisation that for a surface acoustic wave bandpass transversal filter using a substrate anywhere in the range investigated in the Shibayama et al. article, the surface skimming shear wave response identified in that article as the spurious component is at a sufficiently low level and is sufficiently close in frequency to the surface acoustic wave response such that if the filter has a high enough fractional bandwidth then, contrary to the teaching of the Shibayama et al. article and U.K. Patent Specification No. 1,491,250, this "spurious component" does not substantially degrade the stopband performance of the filter. The second factor is the realisation that if no measures are taken to suppress the response of the filter to bulk waves reflected from the bottom of the substrate then, for a filter having a surface acoustic wave response with a fractional bandwidth within a particular range and with an upper stopband at a particular level for a particular frequency range and using a substrate within approximately the range investigated by Shibayama et el. with conventional transducer spacing and substrate thickness, it is these reflected bulk waves which will be the significant spurious component which can degrade the stopband performance of the filter in this upper frequency range. The third factor is a theoretical investigation of total bulk wave power generated by a surface acoustic wave transducer and an experimental investigation of filters as particularised in the just-mentioned second factor which leads to the identification of a new range of $\theta°$ rotated Y-cut X-propagating lithium niobate substrates which includes optimum cuts for these filters at angles different from the 127.86° angle recommended by Shibayama et al.

The article by R. S. Wagers in the IEEE Transactions on Sonics and Ultrasonics, Vol. SU-23, No. 2, March 1976 at pages 113 to 127 is also concerned with finding substrates for use in surface acoustic wave filters to provide low spurious responses. Cuts between 30° ZYW and 60° ZYW lithium niobate are recommended. This is equivalent to a range of $+\theta°$ rotated Y-cut lithium niobate substrates with $\theta$ between 120° and 150°, but it is clear from the reference in the paper to the associated ZY sagittal plane that these cuts are recommended for use with propagation normal to the X direction. The teaching of this article is moreover concerned with the number and spacing of plate modes and in particular with the spacing between the velocities of the slowest bulk wave and the Rayleigh wave, such that it does not lead in any way towards the present invention. U.S. Pat. No. 4,016,440 corresponds in disclosure and teaching with the Wagers article and the same comments are applicable.

Figure 2:
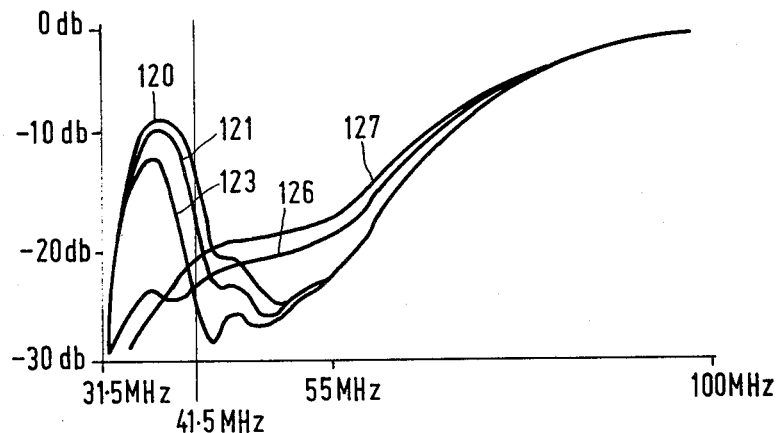
Figure 3:
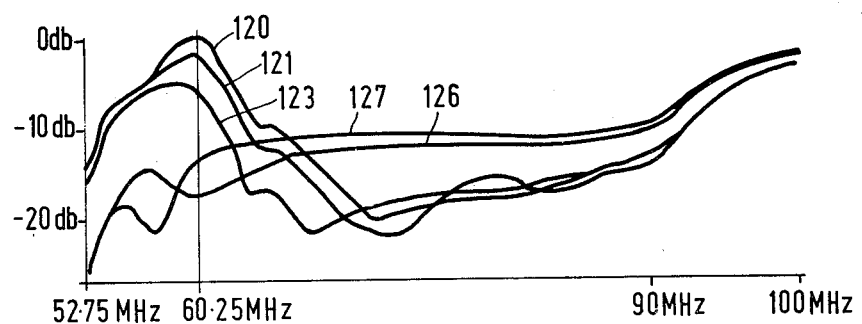
Figure 7:
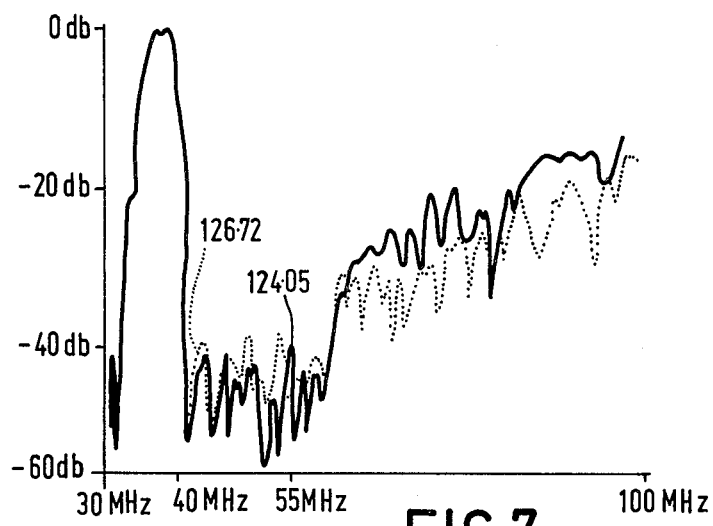
Figure 8:
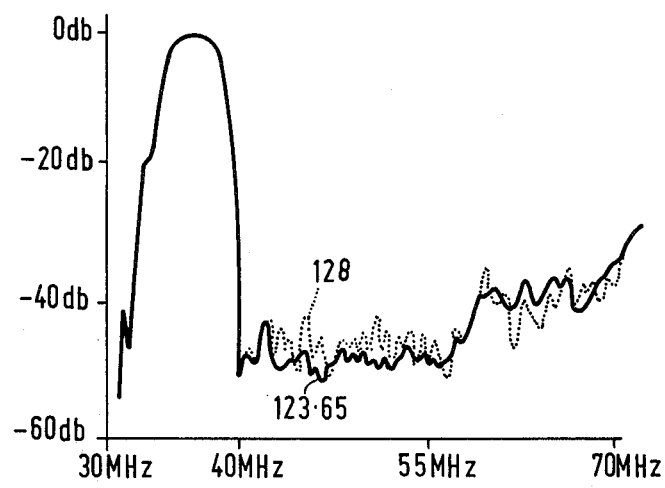
Figure 9:
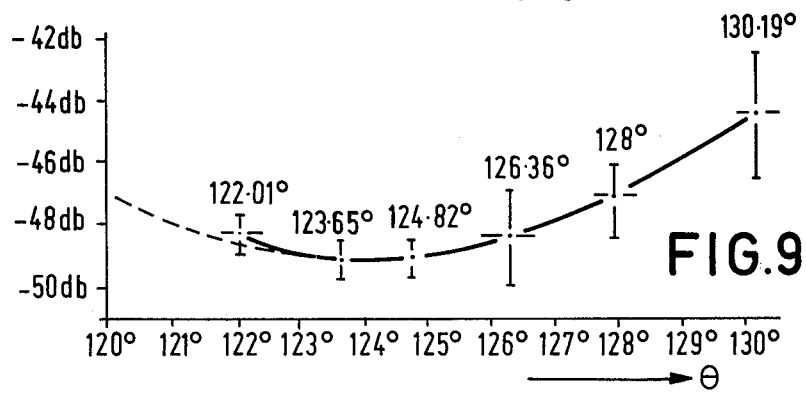

The present invention will now be described in more detail with reference to the accompanying drawings, in which:

FIGS. 1A, 1B and 1C illustrate the crystalline orientations of three different lithium niobate plates having inerdigital transducers on a major surface for surface acoustic wave propagation, FIG. 2 shows the theoretical variation with frequency of total bulk acoustic wave power generated in five $+\theta°$ rotated Y-cut lithium niobate substrates by a transducer having the first nulls of its $(\sin x/x)^2$ surface acoustic wave response at 31.5 MHz and 41.5 MHz, FIG. 3 shows the same theoretical results as shown in FIG. 2 but for a transducer having the first nulls of its $(\sin x/x)^2$ response at 52.75 MHz and 60.25 MHz, FIG. 4 shows the theoretical variation with frequency of total acoustic wave power and of surface skimming bulk acoustic wave power transmitted in the X plane in a 123° rotated Y-cut lithium niobate substrate between two transducers which are each the same as the transducer as mentioned in relation to FIG. 2, FIG. 5 shows the experimental variation with frequency of the response of two transducers as mentioned in relation to FIG. 2 arranged on a major surface of a 122° rotated Y-cut lithium niobate substrate for propagation of surface acoustic waves in the X direction, FIGS. 6A and 6B show the experimental amplitude-frequency response from 30 MHz to 46 MHz of a surface acoustic wave U.K. system television intermediate frequency filter comprising a $+\theta°$ rotated Y-cut X-propagating lithium niobate substrate for five different values of $\theta$, FIG. 7 shows the experimental amplitude-frequency response for two of the filters described in relation to FIG. 6A over an extended frequency range from 30 MHz to 100 MHz, FIG. 8 shows the experimental amplitude-frequency response from 30 MHz to 70 MHz of further filters of the type described in relation to FIGS. 6A and 6B for two other values of $\theta$, and FIG. 9 shows the experimental variation with $\theta$ of the mean upper stopband level between 41.5 MHz and 55 MHz of a number of filters of the type described in relation to FIGS. 6A and 6B.

FIGS. 1A, 1B and 1C show the mutually perpendicular conventional Z, Y and X axes appropriate to single crystal lithium niobate. FIG. 1A shows a Y-cut substrate, which is so defined by the normal N to the major surface of the substrate being parallel to the $+Y$ axis. An input interdigital transducer T1 and an output interdigital transducer T2 are arranged on the major surface to respectively launch and receive surface acoustic waves propagating along the direction of the arrow P which is parallel to the Z axis. Since the properties of the substrate regarding the propagation of acoustic waves are dependent on the direction of propagation, the substrates with the transducers so arranged is known as Y-cut Z-propagating lithium niobate. FIG. 1B shows a $+\theta°$ rotated Y-cut substrate, which is so defined by the normal N to the major surface of the substrate being rotated $\theta°$ about the X axis in a sense from the $+Y$ axis towards the $+Z$ axis with the transducers T1 and T2 arranged for surface acoustic wave propagation along the arrow P in the X direction. A substrate with the transducers so arranged is known as $+\theta°$ rotated Y-cut X-propagating lithium niobate and is the type of substrate and transducer arrangement with which this invention is concerned. FIG. 1C also shows a $+\theta°$ rotated Y-cut substrate but with the transducers T1 and T2 arranged for propagation of surface acoustic waves along the arrow P normal to the X direction. This is the type of substrate and transducer arrangement recommended by R. S. Wagers as mentioned above. The substrates shown in FIGS. 1A, 1B and 1C are plates with unequal length and width and may be described respectively as a YZ plate, a $+(\theta-90)°$ ZXL plate and a $+(\theta-90)°$ ZYW plate according to the 1949 IRE standards on piezoelectric crystals in which the first letter denotes the crystal axis in the direction of the thickness of the plate prior to rotation, the second letter denotes the crystal axis in the direction of the length of the plate prior to rotation and the third letter (L=length and W=width) denotes the axis of first rotation with a positive sign indicating anticlockwise rotation. This invention is concerned with substrates which could be described as either ZXL plates or ZYW plates but which have the transducers arranged such that in either case they are rotated Y-cut X-propagating substrates.

FIG. 2 shows the results of a theoretical calculation of the variation with frequency of the total bulk acoustic wave power generated in a $+\theta°$ rotated Y-cut lithium niobate substrate by a surface acoustic wave transducer arranged on a major surface of that substrate and aligned for surface acoustic wave propagation in the X direction for five different values of $\theta$. The transducer is an unweighted transducer having a $(\sin x/x)^2$ surface acoustic wave response with the nulls of the main lobe at 31.5 MHz and 41.5 MHz which are the frequencies for the adjacent picture trap and adjacent sound trap of a U.K. system television receiver intermediate frequency filter. Such an unweighted transducer would normally be one of the two transducers of such a filter, the other transducer being weighted. It is possible to always regard the unweighted transducer as the input transducer since the filter response is independent of which transducer is actually used as the input. The calculations used the method described in the article by R. F. Milsom et al. in IEEE Transactions on Sonics and Ultrasonics, Vol. SU-24, No. 3, May 1977 at pages 147 to 166 and the material constants given in the article by R. T. Smith et al. in Journal of Applied Physics, Vol. 42, 1971 at pages 2219 to 2230. The calculations assumed an infinite thickness of the substrate and were performed for the complete range of values of $\theta$. Calculations show that the maximum electromechanical coupling coefficient $k^2$ for surface acoustic waves is 0.055 at $\theta = 130°$ and decreases with decreasing values of $\theta$, for example to $k^2 = 0.052$ at $\theta = 128°$, $k^2 = 0.047$ at $\theta = 124°$ (which is the same value as for conventional Y-cut Z-propagating lithium niobate), $k^2 = 0.045$ at $\theta = 122°$ and $k^2 = 0.041$ at $\theta = 120°$. The five values of $\theta$ chosen for illustration in FIG. 2 are $\theta = 120°$ (which is the angle below which it is considered that $k^2$ may be unacceptably low), $\theta = 121°$, $\theta = 123°$, $\theta = 126°$ and $\theta = 127°$ (which is an angle just below the value of 127.86° recommended as an optimum by Shibayama et al. as mentioned in the introduction of this specification). The curves show that within the surface acoustic wave main lobe frequency range of 31.5 MHz to 41.5 MHz the total bulk wave power generated decreases with increasing angle $\theta$ from 120° to 127° and the calculations further show that within this frequency range the total bulk wave power increases with increasing angles $\theta$ above 127°. At the surface acoustic wave passband upper frequency null of 41.5 MHz the total bulk wave power generated decreases with increasing angles $\theta$ from 120° to 123°, stays approximately the same with increasing angle $\theta$ from 123° to 126° and then increases with increasing angles $\theta$ above 126°. In the surface acoustic wave upper frequency stopband region from 41.5 MHz to approximately 55 MHz the total bulk wave power generated decreases with increasing angle $\theta$ from 120° to a minimum at about 122° to 123° and then increases with increasing angle $\theta$ above 123°. Above 55 MHz the total bulk wave power generated increases with increasing frequency over the entire range of angles $\theta$ between 120° and 130° and levels off at about 100 MHz to a substantially constant value (shown as 0 db) which is substantially the same over the range of angles $\theta$ between 120° and 130°.

FIG. 3 shows the results of a calculation which is the same in all respects as that illustrated in FIG. 2 except that the (sin x/x)² surface acoustic wave response of the transducer has the nulls of the main lobe at 52.75 MHz and 60.25 MHz which are the frequencies for the adjacent picture trap and the adjacent sound trap of a Japanese system television receiver intermediate frequency filter. The five values of $\theta$ chosen for illustration in FIG. 3 are the same as those chosen for illustration in FIG. 2 for the same reasons. The curves show that within the surface acoustic wave main lobe frequency range of 52.75 MHz to 60.25 MHz the total bulk wave power generated decreases with increasing angle $\theta$ from 120° to 127° and the calculations further show that within this frequency range the total bulk wave power increases with increasing angles $\theta$ above 127°. At the surface acoustic wave passband upper frequency null of 60.25 MHz the total bulk wave power generated decreases with increasing angles $\theta$ from 120° to 126° and then increases with increasing angles $\theta$ above 126°. In the surface acoustic wave upper frequency stopband region from 60.25 MHz to approximately 90 MHz the total bulk wave power generated decreases with increasing angle $\theta$ from 120° to a minimum at about 123° to 124° and then increases with increasing angle $\theta$ above 124°. Above 90 MHz the total bulk wave power generated increases with increasing frequency over the entire range of angles $\theta$ between 120° and 130°. The significant difference between FIGS. 2 and 3 is that for the smaller fractional bandwidth transducer relevant to FIG. 3 the peak values of bulk wave power in the region of the surface acoustic wave main lobe are at a higher frequency relative to that main lobe with the result that the minimum bulk wave power generated at the upper frequency passband null occurs at a higher angle $\theta$.

FIG. 4 shows the result of a theoretical calculation of the variation with frequency of two different acoustic wave responses of two surface acoustic wave transducers arranged on a major surface of a 123° rotated Y-cut lithium niobate substrate of inifinite thickness for propagation of surface acoustic waves in the X direction. The two transducers are each the same as the transducer described in relation to FIG. 2 having a (sin x/x)² surface acoustic wave response with the nulls of the main lobe at 31.5 MHz and 41.5 MHz. The method of calculation and the piezoelectric material constants used are the same as those specified above in relation to FIG. 2. The response shown by the full line curve is that for all acoustic waves, that is to say both surface acoustic waves and bulk acoustic waves of all types. The response shown by the dotted line curve is that for surface skimming bulk acoustic waves only and shows two responses each having approximately a (sin x/x)⁴ shape of approximately the same bandwidth as the surface acoustic wave response of the transducers but at a lower level. The dotted line response closest in frequency to the major lobe of the full line response can be identified with surface skimming shear bulk acoustic waves and has a peak whose frequency has a ratio of 1.025:1 compared with the frequency of the peak of the full line response which is the ratio of the velocity of surface skimming shear bulk acoustic waves to that of surface acoustic waves in the chosen substrate in the X direction. The dotted line response at the higher frequency can be identified with surface skimming longitudinal bulk acoustic waves and has a peak whose frequency has a ratio of 1.67:1 compared with the frequency of the peak of the full line response which is the ratio of the velocity of surface skimming longitudinal bulk acoustic waves to that of surface acoustic waves in the chosen substrate in the X direction.

A comparison of FIG. 4 with the curve shown in FIG. 2 for 123° rotated Y-cut lithium niobate illustrates the following theoretical conclusions. In the frequency range from a little above 31.5 MHz to a little above 41.5 MHz, the bulk wave power generated is substantially entirely due to surface skimming shear bulk acoustic waves. In this frequency range the bulk wave signals is at a high level, that is its peak is only approximately 30 db below that of the surface acoustic wave response, but nevertheless the (sin x/x)⁴ shape of the surface acoustic wave response is not distorted and the null of the surface acoustic wave response at 41.5 MHz is degraded by only about 10 db and is still 60 db below the peak of the main lobe. This lack of distortion of the surface acoustic wave response and small degradation of the upper frequency first null is mainly due to the high bandwidth of the main lobe of the surface acoustic wave response relative to the small difference in velocity between surface acoustic waves and surface skimming shear bulk acoustic waves for this substrate and propagation direction and is also due to the relatively steep slope of the main lobe of the (sin x/x)$^4$ response for both surface acoustic waves and surface skimming shear bulk acoustic waves. In the frequency range from 41.5 MHz to approximately 55 MHz the total bulk wave power generated is substantially entirely shear bulk acoustic waves propagating at an angle to the surface on which the transducers are arranged and it is at a low level such that it does not degrade the (sin x/x)$^4$ surface acoustic wave response with a finite substrate. In the frequency range above approximately 55 MHz to approximately 68 MHz the total wave power generated is both shear bulk acoustic waves propagating at an angle to the surface and surface skimming longitudinal bulk acoustic waves and it is at an increased level such that it does degrade the (sin x/x)$^4$ surface acoustic wave response with a finite substrate. In the frequency range above approximately 68 MHz (not shown) the total bulk wave power generated is both shear and longitudinal bulk acoustic waves propagating at an angle to the surface and is at a further increased level such that it further degrades the surface acoustic wave response with a finite substrate.

FIG. 5 shows the experimental variation with frequency of two different acoustic wave responses of a pair of surface acoustic wave transducers arranged on a major surface of a 122° rotated Y-cut lithium niobate substrate for propagation of surface acoustic waves in the X direction. Each of the two transducers is the same as that described in relation to FIGS. 2 and 4 having a (sin x/x)$^2$ surface acoustic wave response with the nulls of the main lobe at 31.5 MHz and 41.5 MHz. The substrate has a conventional thickness of ½ mm and the two transducers are in line with a separation of approximately 2 mm. A multistrip coupler is not present on the major surface of the substrate between the two transducers and no measures are taken to suppress the reflection of bulk waves by the bottom surface of the substrate. The response shown by the full line curve is that for all acoustic waves, that is to say for surface acoustic waves and bulk acoustic waves of all types. The response shown by the dotted lines curve was obtained by placing wax on the major surface of the substrate to absorb surface acoustic waves and is therefore that for bulk acoustic waves including both surface skimming bulk acoustic waves propagating directly between the two transducers and bulk acoustic waves propagating indirectly between the two transducers by reflection from the bottom surface of the substrate. The two curves shown in FIG. 5 are in agreement with the theoretical results discussed above in relation to FIGS. 2 and 4. In the frequency range from 31.5 MHz to 41.5 MHz the full line curve has a (sin x/x)$^4$ shape which is the surface acoustic wave response of the two transducers undistorted by the surface skimming shear bulk acoustic wave response which is in a slightly higher frequency range. The null at 41.5 MHz is only degraded to a small extent and is approximately 45 db below the peak response. In the frequency range from 41.5 MHz to approximately 55 MHz the full line curve continues to have the (sin x/x)$^4$ surface acoustic wave response shape which is substantially undegraded by the low level of the indirect shear bulk acoustic wave response. In the frequency range above approximately 55 MHz to approximately 68 MHz the curves show that the surface acoustic wave response is degraded by indirect shear bulk acoustic waves and direct longitudinal bulk acoustic waves, and in the frequency range have approximately 68 MHz the curves show that the surface acoustic wave response is increasingly degraded by the increasing level of response to indirect shear and longitudinal bulk acoustic waves.

FIGS. 6A and 6B show the experimental amplitude-frequency response of a surface acoustic wave U.K. system television intermediate frequency filter comprising a $+\theta°$ rotated Y-cut lithium niobate substrate for five different values of $\theta$. The filter consists in each case of the same pair of transducers which are arranged on a major surface of the substrate for propagation of surface acoustic waves in the X direction. The substrate in each case has a conventional thickness of ½ mm., and the two transducers are respectively approximately 4 mm. and 1 mm. long in the X direction with a separation of approximately 2 mm. The two transducers are in line, a multistrip coupler is not present and no measures are taken to suppress the reflection of bulk waves by the bottom surface of the substrate. The five values of $\theta$ are 129.06°, 126.72°, 124.05°, 122.6° and 121.24°. As has been mentioned above in the discussion of FIG. 2, the electromechanical coupling coefficient k$^2$ for surface acoustic waves decreases with decreasing values of $\theta$ over this range such that the insertion loss of the filters in fact increases by approximately 6 db over this range of $\theta$. However, for the sake of comparison the response shown in FIGS. 6A and 6B have been adjusted to show the same insertion loss at a value 0 db. The variation of the velocity of surface acoustic waves over the range of $\theta$ is approximately ±1 part in a thousand, and the velocity of shear and longitudinal bulk acoustic waves does not vary over this range of $\theta$. The full line curve in both FIGS. 6A and 6B shows the filter response in the frequency range 30 MHz to 46 MHz for $\theta = 124.05°$ and therefore also shows the filter response for the other four values of $\theta$ from 30 MHz to a little below the adjacent sound trap frequency of 41.5 MHz. The curves shown for the other four values of $\theta$ in the frequency range from a little below 41.5 MHz up to 46 MHz, which in each case are curves for single examples only, illustrate clearly the improvement in this adjacent upper frequency stopband region with decreasing values of $\theta$ from 129.06° (dashed curve in FIG. 6A) to 126.72° (dotted curve in FIG. 6A) to 124.05° in agreement with what is to be expected from the theoretical results discussed above and shown in FIG. 2. From the single examples shown there would not appear to be a great difference in this stopband performance between $\theta = 124.05°$ and $\theta = 122.6°$ (dashed curve in FIG. 6B), but the much poorer stopband level for $\theta = 121.24$ (dotted curve in FIG. 6B) at the adjacent sound trap frequency of 41.5 MHz is in agreement with what is to be expected from the theoretical results discussed above and shown in FIG. 2.

FIG. 7 shows the experimental amplitude-frequency response for the same filters described above with respect to FIG. 6A for the values of $\theta = 124.05°$ (full curve) and $\theta = 126.72°$ (dotted curve) over an extended frequency range from 30 MHz to 100 MHz. The improvement in the upper frequency stopband performance up to approximately 55 MHz for $\theta = 124.05°$ compared with $\theta = 126.72°$ is readily apparent.

The experimental amplitude-frequency responses have been measured for a further series of surface acoustic wave U.K. system television intermediate frequency filters comprising a $+\theta$ rotated Y-cut lithium niobate substrate. Measurements were made for 16 filters at $\theta = 122.01°$, 17 filters at $\theta = 123.65°$, 18 filters at $\theta = 124.82°$, 18 filters at $\theta = 126.36°$, 19 filters at $\theta = 128°$ and 19 filters at $\theta = 130.19°$. Except for the different values of $\theta$, the filters are the same in each case as the filter described above in relation to FIGS. 6A, 6b and 7.

FIG. 8 shows a comparison between the amplitude-frequency response of the above-described filters at $\theta = 123.65°$ and at $\theta = 128°$. The responses have again been adjusted to show the same insertion loss at a value 0 db and so the full line curve from 30 MHz to just below 41.5 MHz shows the filter responses for both values of $\theta$. From just below 41.5 MHz to 70 MHz, the full line curve shows the upper envelope (i.e. the overall worst response) of the response of five filters at $\theta = 123.65°$ and the dotted line curve shows the same upper envelope of the response of five filers at $\theta = 128°$. The improvement in the upper frequency stopband performance up to approximately 55 MHz for the filters at $\theta = 123.65°$ compared with the filters at $\theta = 128°$ is readily apparent.

The mean value of the upper stopband level, that is to say the level of the amplitude-frequency response below the maximum passband level, between 41.5 MHz and 55 MHz has been measured for all the filters mentioned in the penultimate paragraph. The full line curve of FIG. 9 is drawn through the mean value of this mean upper stopband level for all the filters at each value of $\theta$. The vertical bars at each value of $\theta$ indicate the $2\sigma$ spread of mean upper stopband levels for the number of filters measured at that value of $\theta$ where $\sigma$ is the standard deviation. The frequency range of 41.5 MHz to 55 MHz was chosen as the frequency range within which the degradation of the surface acoustic wave stopband response of the filters is substantially due only to indirect shear bulk acoustic waves and within which there is a significant variation with the rotation angle $\theta$ of the substrate as will be understood from the previous description in relation to FIGS. 2 and 4 to 7. This frequency range is also the upper stopband range which is of most interest for these filters, because it is conventional to provide tuning networks in the television receiver circuits in which these filters are incorporated which suppress the response at frequencies above this range. The mean stopband level in this frequency range was chosen for measurement because, as can be seen in FIGS. 6A, 6B, 7 and 8 there is a considerable fluctuation in the actual stopband level in this frequency range for each filter, particularly with those filters which are designed to have a deep trap at the 41.5 MHz frequency immediately adjacent the passband. There is, however, found to be a sufficiently consistent relationship between the mean stopband level and the maximum stopband level in this frequency range, that is to say a difference of approximately 8 db, such that the ability of filters made on a substrate at a particular value of $\theta$ to meet a given specification for the filters can be usefully predicted.

The full line curve of FIG. 9 indicates that the value of $\theta$ for surface acoustic wave U.K. television receiver intermediate frequency filters which provides the best upper frequency stopband performance is 124°. It is to be noted that this experimental value is higher than the optimum value at about 122° to 123° predicted by the theoretical results described in relation to FIG. 2. With increasing values of $\theta$ above 124° the upper stopband performance deteriorates, but it is apparent that at $\theta = 127°$ the upper stopband performance is still approximately 1 db better than at $\theta = 127.86°$ which is recommended as the optimum value for surface acoustic wave filters by Shibayama et al. as discussed in the introduction of this specification. It is clear that the upper stopband performance also deteriorates with decreasing values of $\theta$ below 124°. Theoretical considerations indicate that the upper stopband performance variation with $\theta$ should be approximately symmetrical with respect to the optimum value of $\theta$ and the dotted line curve in FIG. 9 shows a symmetrical extrapolation below $\theta = 124°$ of the full line curve above $\theta = 124°$. The dotted line curve is seen to be not exactly in agreement with the experimental result at $\theta = 122.01°$ but is considered to be a reliable guide to performance at the lower values of $\theta$. According to this extrapolation the mean upper stopband level at $\theta = 121°$ should be the same as at $\theta = 127°$. As has been mentioned above in relation to FIGS. 2, 6A and 6B the electromechanical coupling coefficient $k^2$ for surface acoustic waves and hence the insertion loss of the filters decreases with decreasing values of $\theta$ over the range considered. Taking this variation of $k^2$ into account, $\theta = 121°$ can be considered as a lower limit for good stopband performance over the whole upper frequency range of 41.5 MHz to 55 MHz. However, taking into account the particular requirement for a deep trap at the adjacent sound frequency of 41.5 MHz, $\theta = 122°$ can be considered as a better lower limit for a U.K. system television receiver intermediate frequency filter. It is apparent from the length of the $2\theta$ bars shown in FIG. 9 that the spread in mean upper stopband level for filters made on a substrate at each value of $\theta$ is comparatively small at values of $\theta$ near the optimum value of $\theta = 124°$ and is comparatively large at values of $\theta$ far from the optimum value, particularly at the higher values of $\theta$. This improves still further the possibility of obtaining a good yield of filters meeting a given specification if $\theta$ is chosen near the optimum value of 124°.

A U.K. system television receiver intermediate frequency filter has a fractional bandwidth of 0.274 when calculated as the ratio of the 10 MHz difference between the adjacent sound trap frequency of 41.5 MHz and the adjacent picture trap frequency of 31.5 MHz to the mean value of 36.5 MHz of these two frequencies. By the same method of calculation a Japanese system television receiver intermediate frequency filter having an adjacent sound trap frequency of 60.25 MHz and an adjacent picture trap frequency of 52.75 MHz has a fractional bandwidth of 0.133. It will now be appreciated that the frequency of 90 MHz considered in relation to FIG. 3 has the same significance regarding bulk waves for a surface acoustic wave Japanese system television receiver intermediate frequency filter as the frequency of 55 MHz considered above for a U.K. system filter. The ratio of the velocity of surface skimming longitudinal bulk acoustic waves to that of surface acoustic waves in the chosen substrate in the X direction has the same value of 1.67:1. Hence the surface skimming longitudinal bulk acoustic wave response for the Japanese system filter will have a peak at 94 MHz with approximately the same bandwidth as the surface acoustic wave response, and so the frequency range of 60.25 MHz to 90 MHz considered above in relation to FIG. 3 is the frequency range within which the degradation of the surface acoustic wave stopband response of the Japanese filter is substantially only due to indirect shear bulk acoustic waves and within which there is a significant variation with the rotation angle $\theta$ of the substrate. Taking into account the 1° difference found between the theoretical and experimental optimum values of θ for a U.K. system filter it is expected that the experimental optimum value (which is the true optimum value) of θ for the upper frequency stopband performance as a whole of a Japanese system filter may prove to be between 124° and 125°. Due to the lower fractional bandwidth of the Japanese system filter this possibly slightly higher optimum value of θ would be advantageous for the trap required at the adjacent sound frequency as will be appreciated from the discussion above in relation to FIG. 3. The fractional bandwidths for the other major system television receiver intermediate frequency filters calculated on the same basis are between the values for the U.K. system and the Japanese system; that is to say 0.168 for the U.S.A. system, 0.227 for the French system, 0.236 for the German system and 0.25 for the Australian system. The optimum value of θ for these other system filters is therefore expected to be close to 124°.

If a lithium niobate crystal boule is cut to produce a rotated Y-cut substrate at a nominal value of the angle of rotation θ there may be an error in cutting in practice of ±½°. Taking into account this cutting error, the comparative flatness of the curve shown in FIG. 9 near θ=124° and the small variation in optimum angle which may occur with bandwidth it is expected that surface acoustic wave television receiver intermediate frequency filters manufactured for optimum upper frequency stopband performance according to this invention will be on $+\theta°$ rotated Y-cut X-propagating lithium niobate substrates with θ in the range 123° to 125°. Outside this optimum range, such filters will have an upper frequency stopband performance, taking into account the adjacent sound frequency trap, with θ in the range 122° to 127° according to this invention which is improved in comparison with the previously recommended optimum value of θ=127.86°.

It is considered that the improved upper frequency stopband performance found using $+\theta°$ rotated Y-cut X-propagating lithium niobate substrates with θ in the ranges 123° to 125° and 121° to 127° will also be of advantage in surface acoustic wave bandpass transversal filters other than television intermediate frequency filters. Such other filters may be suitably defined, according to this invention, as those in which the surface acoustic wave response of the filter has a passband with a 35 db fractional bandwidth Δ in the range 0.05 to 0.5 and has an upper stopband of at least 35 db from said passband up to a frequency approximately equal to $$\left(\frac{V_L}{V_S} - \frac{\Delta}{2}\right)$$

$F_C$ where $V_L$ and $V_S$ are the velocities in the X direction of the substrate of longitudinal bulk acoustic waves and surface acoustic waves respectively and $F_C$ is the centre frequency relative to the 35 db fractional bandwidth Δ. In this definition, the stopband level of at least 35 db is chosen as that appropriate to practical filters. The formula used to define the upper frequency limit of the upper stopband will be understood from the above description and discussion in relation to FIGS. 2 to 9. The television receiver intermediate frequency filters discussed above have fractional bandwidths according to this definition of Δ in the range 0.1 to 0.3. The wider range of fractional bandwidths is chosen for the following reasons. For values of Δ less than 0.05 the peak of the surface skimming bulk acoustic wave response will intrude into the stopband of the surface acoustic wave response to such an extent that there will be no advantage in having a substrate in the range specified. For values of Δ greater than 0.5 the frequency range above the surface acoustic wave passband and below the longitudinal surface skimming bulk acoustic wave response of approximately the same bandwidth will be so small that there will be no advantage in having a substrate in the range specified.

It will be appreciated from the above description and discussion that the improvement achieved according to the invention derives from the new range of $+\theta°$ rotated Y-cut X-propagating lithium niobate substrates in which the input transducer located on a major surface generates a low level of shear bulk waves at an angle to that surface. Therefore, there is a better possibility that filters manufactured with these substrates will meet a given specification without any measures being taken to suppress the reflection of bulk waves from the bottom surface of the substrate. However, such measures may be taken within the scope of this invention to further improve the performance of a filter. Also, there is a greater possibility that filters manufactured with these substrates meet a given specification without the incorporation of a multistrip coupler. However, a multistrip coupler may be used within the scope of this invention to further reduce the degradation of the performance of a filter by bulk waves and also to contribute to the surface acoustic wave response of a filter.

We claim:

1. A surface acoustic wave bandpass transversal filter comprising a $+\theta°$ rotated Y-cut lithium niobate substrate, an input and an output transducer each including an interdigital array of strip-like electrodes arranged on the substrate to respectively launch and receive surface acoustic waves propagating in the X direction, characterized in that the spacing, overlap and the number of strip electrodes in said input and output transducer interdigital electrode arrays are chosen and provided so as to cause the transfer response from the input transducer to the output of the output transducer of the filter to have a passband with a 35 db fractional bandwidth Δ in the range 0.05 to 0.5, and to have an upper stopband of at least 35 db from said passband up to a frequency approximately equal to $$\left(\frac{V_L}{V_S} - \frac{\Delta}{2}\right)$$

$F_C$ where $V_L$ and $V_S$ are the velocities in the X direction of the substrate of longitudinal bulk acoustic waves and surface acoustic waves, respectively, and $F_C$ is the centre frequency relative to the 35 db fractional bandwidth Δ, and in that θ° is in the range from 121° to 127°.

2. A filter as claimed in claim 1, in which Δ is in the range from 0.1 to 0.3, in which the surface acoustic wave response of the filter is further shaped to provide a television receiver intermediate frequency filter, and in which θ° is in the range from 122° to 127°.

3. A filter as claimed in claim 1 or claim 2, in which θ is in the range from 123° to 125°.

4. A filter as claimed in claim 1 wherein Δ has a value of 0.168.

5. A filter as claimed in claim 3 wherein Δ has a value of 0.168.

6. A filter as claimed in claim 1 wherein said substrate comprises a piezoelectric ZXL plate or a ZYW plate.

* * * * *

UNITED STATES PATENT AND TRADEMARK OFFICE
CERTIFICATE OF CORRECTION

PATENT NO. : 4,409,571

DATED : October 11, 1983

INVENTOR(S) : ROBERT F. MILSOM ET AL

It is certified that error appears in the above-identified patent and that said Letters Patent is hereby corrected as shown below:

In the Claims:

Claim 1, line 16, change the equation from " $(\frac{V_L}{V_S} - \frac{\Delta}{2})$ " to -- $(\frac{V_L}{V_S} - \frac{\Delta}{2}) F_C$ --

Claim 1, line 17, delete "$F_C$"

Signed and Sealed this

Sixteenth Day of July 1985

[SEAL]

Attest:

DONALD J. QUIGG

Attesting Officer     Acting Commissioner of Patents and Trademarks